United States Patent [19]
Rudolph et al.

[11] Patent Number: 6,062,851

[45] Date of Patent: May 16, 2000

[54] COMBINATION CVI/CVD AND HEAT TREAT SUSCEPTOR LID

[75] Inventors: James Warren Rudolph, Colorado Springs; Scott William Stevens, Pueblo West, both of Colo.

[73] Assignee: The B. F. Goodrich Company, Charlotte, N.C.

[21] Appl. No.: 09/178,395

[22] Filed: Oct. 23, 1998

[51] Int. Cl.[7] ............................................ F27D 1/18
[52] U.S. Cl. ............................................ 432/250; 432/237
[58] Field of Search ................................ 432/237, 238, 432/251, 254.2, 254.1, 250; 48/123, 124; 126/211, 220; 34/62, 66, 83, 393, 394, 428, 433; 165/104.14

[56] References Cited

U.S. PATENT DOCUMENTS 1,933,461 10/1933 Toll .
5,377,297 12/1994 Nuutinen .................................. 392/307
5,910,006 6/1999 Conroy et al. ........................... 432/250

*Primary Examiner*—Denise L. Ferensic
*Assistant Examiner*—Gregory A. Wilson
*Attorney, Agent, or Firm*—Kevin L. Leffel

[57] ABSTRACT

The invention relates to a susceptor lid for use in a CVI/CVD furnace. More specifically, the invention is directed to a lid configured to consecutively run CVI/CVD and heat treatment processes without opening the furnace. The susceptor lid according to the invention comprises a susceptor lid body having a gas exhaust hole; and, an exhaust lid disposed over said gas exhaust hole, said exhaust lid being configured to move within the CVI/CVD furnace from a first position wherein said exhaust lid covers said gas exhaust hole to a second position wherein said gas exhaust lid at least partially uncovers said gas exhaust hole.

19 Claims, 5 Drawing Sheets

COMBINATION CVI/CVD AND HEAT TREAT SUSCEPTOR LID

BACKGROUND

The invention relates to a susceptor lid for use in a CVI/CVD furnace. More specifically, the invention is directed to a lid configured to consecutively run CVI/CVD and heat treatment processes without opening the furnace.

Refractory composites are commonly subjected to heat treatment and CVI/CVD processes. According to prior art processes, different susceptor lids are used for each process because a CVI/CVD susceptor lid is provided with holes, and the heat treatment susceptor lid is imperforate in order to prevent radiative heat transfer through the lid. A lid that may be used for both processes without opening the furnace is desired.

SUMMARY OF THE INVENTION

According to an aspect of the invention, a combined heat treat and CVI/CVD susceptor lid for a furnace susceptor, comprising:

a susceptor lid body having a gas exhaust hole; and, an exhaust lid disposed over said gas exhaust hole, said exhaust lid being configured to move within the CVI/CVD furnace from a first position wherein said exhaust lid covers said gas exhaust hole to a second position wherein said gas exhaust lid at least partially uncovers said gas exhaust hole.

DETAILED DESCRIPTION

Figure 1:
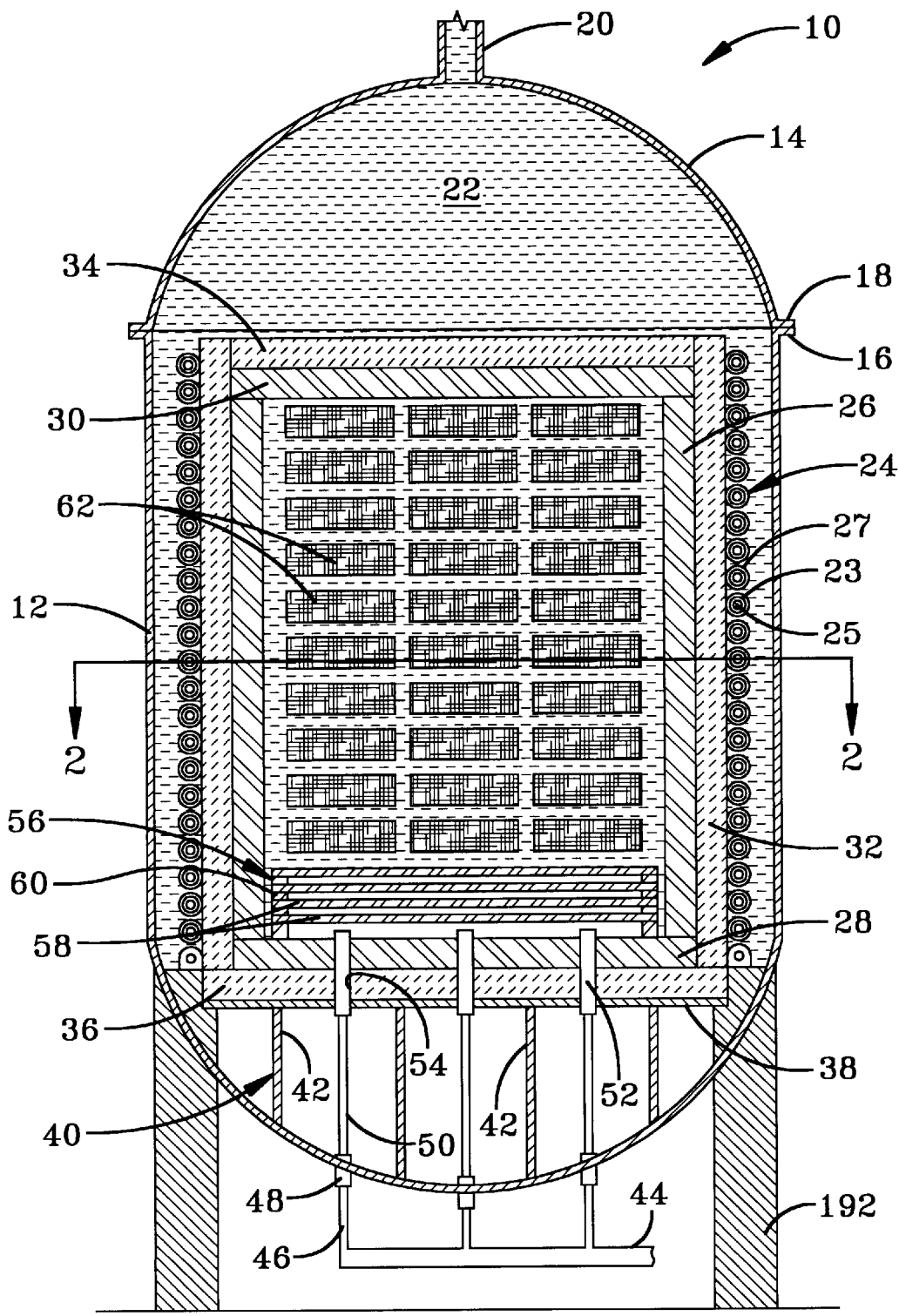
FIG. 1 presents a cross-sectional side view of a CVI/CVD furnace that implements a susceptor lid according to an aspect of the invention.

Various aspects of the invention are presented in FIGS. 1–10 which are not drawn to scale, and wherein like components are numbered alike. Referring now to FIG. 1, a cross-sectional view of a high temperature furnace 10 is presented, by way of example, that implements various aspects of the invention. Furnace 10 is configured to be employed with a high temperature process. As used herein, the term "high temperature" means a temperature substantially elevated above room temperature in the range of 300 C. or greater. Refractory materials, generally, are manufactured and/or processed at temperatures greater than 300 C., and may be on the order of 900–3000 C., or higher. For example, a porous carbon aircraft brake disk may have a pyrolytic carbon matrix deposited within it by a CVI/CVD process conducted at a temperature in the range of 900–1100 C., and may be heat-treated at a temperature up to 2200 C. or higher. Manufacturing and processing other types of ceramic materials may occur at other temperatures. Furnaces are commonly configured specifically for processing refractory composite materials using high temperature processes. Such processes include deposition of a binding matrix within a porous substrate, and heat treatment processes wherein refractory composite materials are heated for a defined period of time in order to alter some aspect of the material properties. Such processes are well known in the art.

Figure 2:
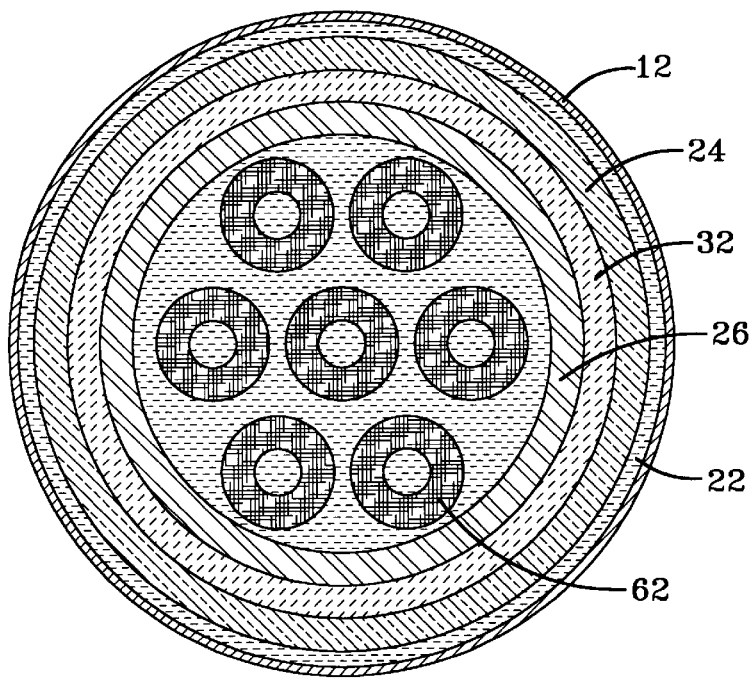
FIG. 2 presents a cross-sectional top view along line 2—2 of FIG. 1.

Furnace 10 is generally cylindrical and comprises a steel shell 12 and a steel lid 14. The shell 12 comprises a flange 16 and the lid 14 comprises a mating flange 18 that seals against flange 16 when the lid 14 is installed upon the shell 12, as shown in FIG. 1. The shell may be configured as a double wall (not shown) with cooling water flowing through the space enclosed by the double wall. The lid also comprises a vacuum port 20. The shell 12 and lid 14 together define a furnace volume 22 that is reduced to vacuum pressure by a steam vacuum generator (not shown) in fluid communication with the vacuum port 20. The shell 12 rests upon a multitude of legs 192. The furnace 10 also comprises a cylindrical induction coil 24 adjacent a cylindrical susceptor 26. The induction coil 24 comprises coiled conductors 23 encapsulated by electrical insulation 27. During operation, the induction coil 24 develops an electromagnetic field that couples with the susceptor 26 and generates heat within the susceptor 26. The induction coil 24 may be cooled, typically by integral water passages 25 within the coil 24. The susceptor 26 rests upon a susceptor floor 28 and is covered by a susceptor lid 30. A cylindrical insulation wall 32 is disposed in between the susceptor 26 and the induction coil 24. Lid insulation layer 34 and floor insulation layer 36 are disposed over the susceptor lid 30 and beneath the susceptor floor 28, respectively. The susceptor floor 28 rests upon the insulation layer 36 which, in turn, rests upon a furnace floor 38. The furnace floor 38 is attached to the shell 12 by a floor support structure 40 that comprises a multitude of vertical web structures 42. A reactant gas is supplied to the furnace 10 by a main gas supply line 44. A multitude of individual gas supply lines 46 are connected in fluid communication with a multitude of gas ports 48 that pass through the furnace shell 12. A multitude of flexible gas supply lines 50 are connected in fluid communication with the gas ports 48 and a multitude of gas inlets 52 that pass through holes 54 in the furnace floor 38, the floor insulation layer 36, and the susceptor floor 28. A gas preheater 56 rests on the susceptor floor 28 and comprises a multitude of stacked perforated plates 58 that are spaced from other by a spacing structure 60. Each plate 58 is provided with an array of perforations that are horizontally shifted from the array of perforations of the adjacent plate 58. This causes the reactant gas to pass back and forth through the plates, which diffuses the reactant gas within the preheater 56 and increases convective heat transfer to the gas from the perforated plates 58. A multitude of porous substrates 62, for example brake disks, are stacked within the furnace 10 inside the susceptor 26 on fixtures (not shown for clarity). Suitable fixtures are well known in the art. Referring now to FIG. 2, a cross-sectional view of the furnace 10 along line 2—2 of FIG. 1 is presented.

Chemical vapor infiltration and deposition (CVI/CVD) is a well known process for depositing a binding matrix within a porous structure. The term "chemical vapor deposition" (CVD) generally implies deposition of a surface coating, but the term is also used to refer to infiltration and deposition of a matrix within a porous structure. As used herein, the term CVI/CVD is intended to refer to infiltration and deposition of a matrix within a porous structure. The technique is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components. The generally known CVI/CVD processes may be classified into four general categories: isothermal, thermal gradient, pressure gradient, and pulsed flow. See W. V. Kotlensky, *Deposition of Pyrolytic Carbon in Porous Solids*, 8 Chemistry and Physics of Carbon, 173, 190–203 (1973); W. J. Lackey, *Review, Status, and Future of the Chemical Vapor Infiltration Process for Fabrication of Fiber-Reinforced Ceramic Composites*, Ceram. Eng. Sci. Proc. 10[7–8] 577, 577–81 (1989) (W. J. Lackey refers to the pressure gradient process as "isothermal forced flow"). In an isothermal CVI/CVD process, a reactant gas passes around a heated porous structure at absolute pressures as low as a few torr. The gas diffuses into the porous structure driven by concentration gradients and cracks to deposit a binding matrix. This process is also known as "conventional" CVI/CVD. The porous structure is heated to a more or less uniform temperature, hence the term "isothermal." In a thermal gradient CVI/CVD process, a porous structure is heated in a manner that generates steep thermal gradients that induce deposition in a desired portion of the porous structure. The thermal gradients may be induced by heating only one surface of a porous structure, for example by placing a porous structure surface against a susceptor wall, and may be enhanced by cooling an opposing surface, for example by placing the opposing surface of the porous structure against a liquid cooled wall. Deposition of the binding matrix progresses from the hot surface to the cold surface. In a pressure gradient CVI/CVD process, the reactant gas is forced to flow through the porous structure by inducing a pressure gradient from one surface of the porous structure to an opposing surface of the porous structure. Flow rate of the reactant gas is greatly increased relative to the isothermal and thermal gradient processes which results in increased deposition rate of the binding matrix. This process is also known as "forced-flow" CVI/CVD. Finally, pulsed flow involves rapidly and cyclically filling and evacuating a chamber containing the heated porous structure with the reactant gas. The cyclical action forces the reactant gas to infiltrate the porous structure and also forces removal of the cracked reactant gas by-products from the porous structure. The furnace and fixture configuration may vary substantially depending upon the type of process, and the various aspects of the invention may be implemented with any of these processes, depending upon the particular configuration. As such, the furnace configuration of FIGS. 1 and 2 is presented by way of example, and is not intended to limit the invention to the specific arrangement presented.

Figure 3:
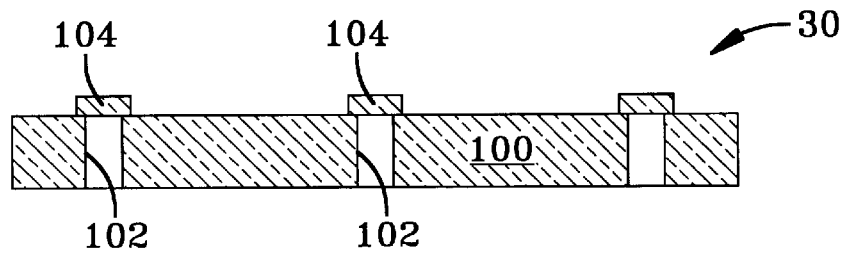
FIG. 3 presents a cross-sectional side view of a susceptor lid according to an aspect of the invention wherein the exhaust holes are covered.
Figure 4:
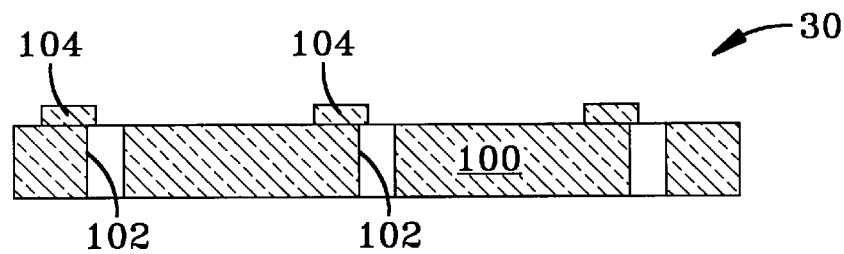
FIG. 4 presents a cross-sectional side view of the FIG. 3 susceptor lid with the exhaust holes uncovered.
Figure 5:
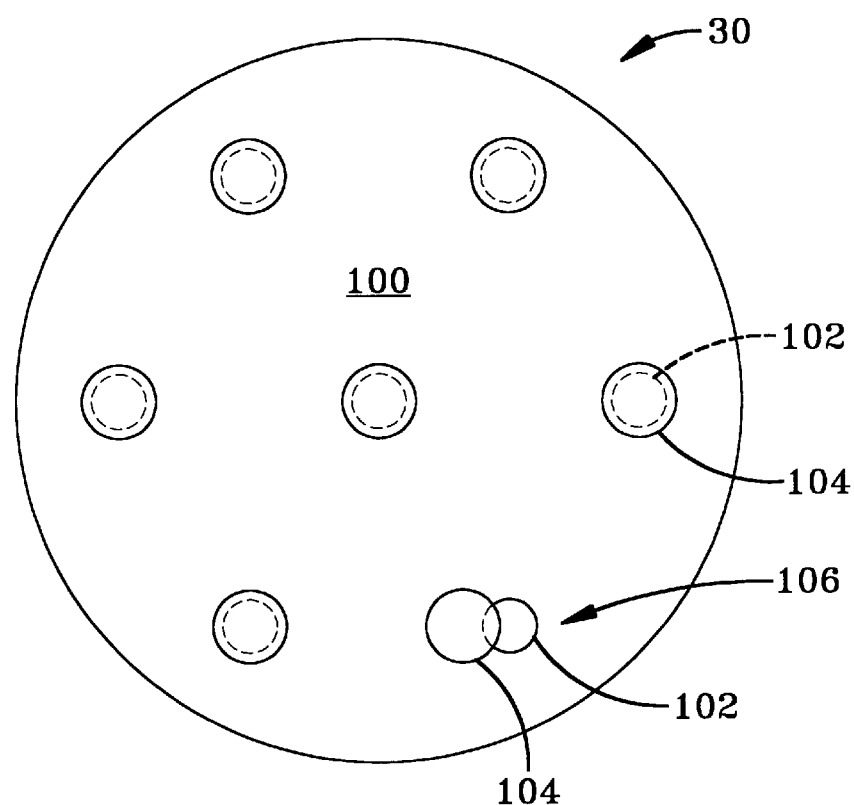
FIG. 5 presents a top view of a susceptor lid according to an aspect of the invention.

Referring now to FIGS. 3 and 4, cross-sectional views of the susceptor lid 30 are provided, according to an aspect of the invention. The susceptor lid 30 comprises a susceptor lid body 100 having a gas exhaust hole 102 and an exhaust lid 104 disposed over the gas exhaust hole 102. The gas exhaust hole 102 allows reactant gas introduced into the furnace 10 through the gas inlets 52 to pass through the susceptor lid 30 to the vacuum port 20. The exhaust lid 104 is configured to move within the CVI/CVD furnace 10 from a first position, as presented in FIG. 3, wherein the exhaust lid 104 covers the gas exhaust hole 102 to a second position, as indicated in FIG. 4, wherein the gas exhaust lid 104 at least partially uncovers the gas exhaust hole 102. According to a preferred embodiment the susceptor lid body 100 comprises a plurality of gas exhaust holes 102 and a plurality of exhaust lids 104 disposed over the gas exhaust holes 102, each gas exhaust hole 102 having a corresponding exhaust lid 104 configured to move from a first position wherein that exhaust lid 104 covers that gas exhaust hole 102 to a second position wherein that exhaust lid 104 at least partially uncovers that gas exhaust hole 102. The exhaust lid 104 is preferably seated upon the susceptor lid body 100. Referring now to FIG. 5, a top view of the susceptor lid 30 is provided showing all of the exhaust lids 104 in the first position wherein the gas exhaust holes 102 are covered except for one gas exhaust lid 104 that is presented in the second position wherein one gas exhaust hole 102 is at least partially uncovered, as indicated by 106. In certain preferred embodiments, one or more exhaust lids 104 are configured to reversibly move from the first position to the second position during a CVI/CVD process without opening the furnace. According to a preferred embodiment, the exhaust lid 104 is seated upon the susceptor lid body 100 disposed over the gas exhaust hole 102, and the exhaust lid is configured to remain in a first position wherein the exhaust lid 104 covers the gas exhaust hole 102 in the absence of gas flow through the gas exhaust hole 102 and to be movable solely by flow of gas through the gas exhaust hole 102 to a second position wherein the gas exhaust lid 104 at least partially uncovers the gas exhaust hole 102. According to a certain embodiment, the exhaust lid 104 is a relatively light piece of insulating material that is placed over the gas exhaust hole 102. Initiating gas flow through the gas exhaust hole 102 blows the exhaust lid 104 off of the gas exhaust hole thereby uncovering it. Further embodiments are disclosed herein, although it is not intended to limit the invention to a specific embodiment since variations are evident to those persons skilled in the art in light of the description provided herein.

Figure 6:
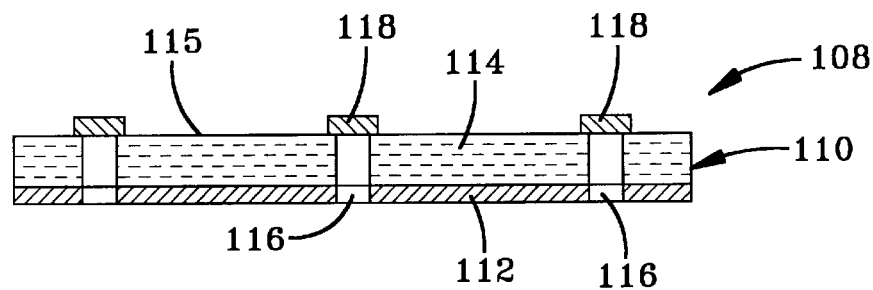
FIG. 6 presents a side cross-sectional view of a susceptor lid according to an aspect of the invention.

Referring now to FIG. 6, a cross-sectional view of a susceptor lid 108 is presented according to a further aspect of the invention. The susceptor lid 108 comprises a susceptor lid body 110 that comprises a susceptor plate 112 and an insulation layer 114 overlying the susceptor plate 112. A gas exhaust hole 116 is provided through the susceptor plate 112 and the insulation layer 114, and an exhaust lid 118 covers the gas exhaust hole 116 that operates in the same manner as the exhaust lid 104 of FIGS. 3–5. A plurality of gas exhaust holes 116 and corresponding exhaust lids 118 are preferably provided. The susceptor plate 112 is made from a material that interacts with the susceptor coil magnetic field in the same manner as the susceptor 26 of FIGS. 1 and 2. The insulation layer 114 may superpose the susceptor plate 112 and be attached thereto, and may define an exposed upper surface 115 having sufficient rigidity to permit furnace service personnel to walk on the exposed surface 115 without damaging the insulation layer 114.

Figure 7:
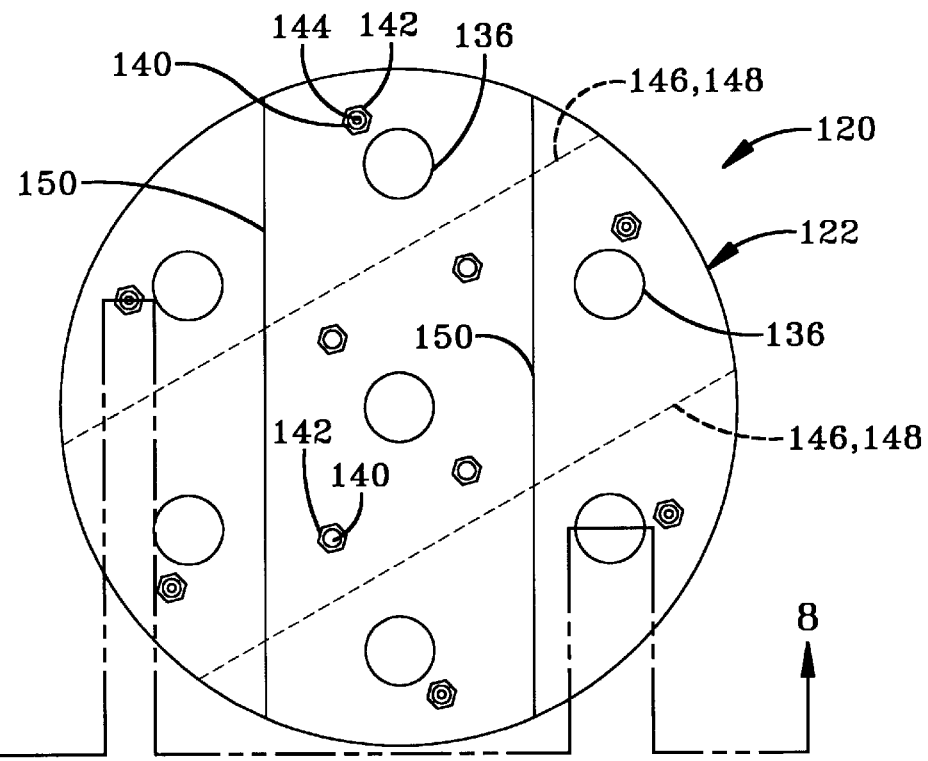
FIG. 7 presents a top view of a susceptor lid according to a certain embodiment of the invention.
Figure 8:
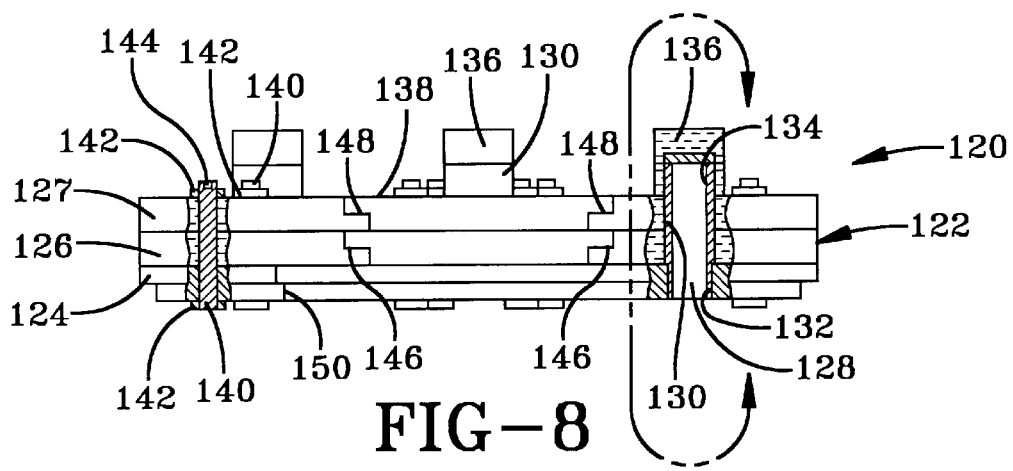
FIG. 8 presents a side cross-sectional view of the FIG. 7 susceptor lid along line 8—8.

Referring now to FIGS. 7 and 8, a susceptor lid 120 is presented according to a certain preferred embodiment, which features various aspects of the invention that may be employed alone or in combination. FIG. 7 presents a top view of the susceptor lid 120, and FIG. 8 presents a side view of the susceptor lid 120 with portions broken away as indicated by line 8—8 of FIG. 7. The susceptor lid 120 comprises a susceptor lid body 122. The susceptor lid body 122 comprises a susceptor plate 124, a first insulation layer 126, a second insulation layer 127, a gas exhaust hole 128, and a gas exhaust tube 130 attached to the susceptor plate 124 with one end 132 encircling the gas exhaust hole 128. An exhaust lid 136 is seated upon an opposing end 134 of the gas exhaust tube 130. The first insulation 126 is made from a softer material with better insulation properties than the second insulation layer 127, while the second insulation layer 127 is made from a more rigid material than the first insulation layer 127 to increase the overall mechanical strength of the susceptor lid 120 and to provide an exposed upper surface 138 having sufficient rigidity to permit furnace service personnel to walk on the exposed surface 138 without damaging the first and second insulation layers 126 and 127. The susceptor plate 124, first insulation layer 126 and second insulation layer 127 are superposed and held together by a multitude of tie-rods 140 and nuts 142 threaded onto the tie-rods 140. The tie-rods 140 closest to the periphery are provided with a threaded hole 144 into which a threaded eye-bolt (not shown) may be inserted for lifting and moving the susceptor lid 120. The threaded eye-bolts are typically removed during a CVI/CVD or heat treatment process. A susceptor lid for a large CVI/CVD or heat treatment furnace is typically several feet in diameter and may exceed the stock widths of the materials used to construct the lid. In such case, each layer of the lid may be assembled from smaller sub-components. For example, lap joints 146 and 148 may be provided in the first and second insulation layers 126 and 127, respectively, and lap joints 150 may be provided in the susceptor plate 124, thereby breaking each of these layers into narrower sub-components. The lap joints 150 are preferably shifted in angle relative to the lap joints 146 and 148 in order to increase the overall strength of the susceptor lid 120. Lapping the joints prevents shine-through of radiation through the susceptor lid 120.

Figures 9, 10:
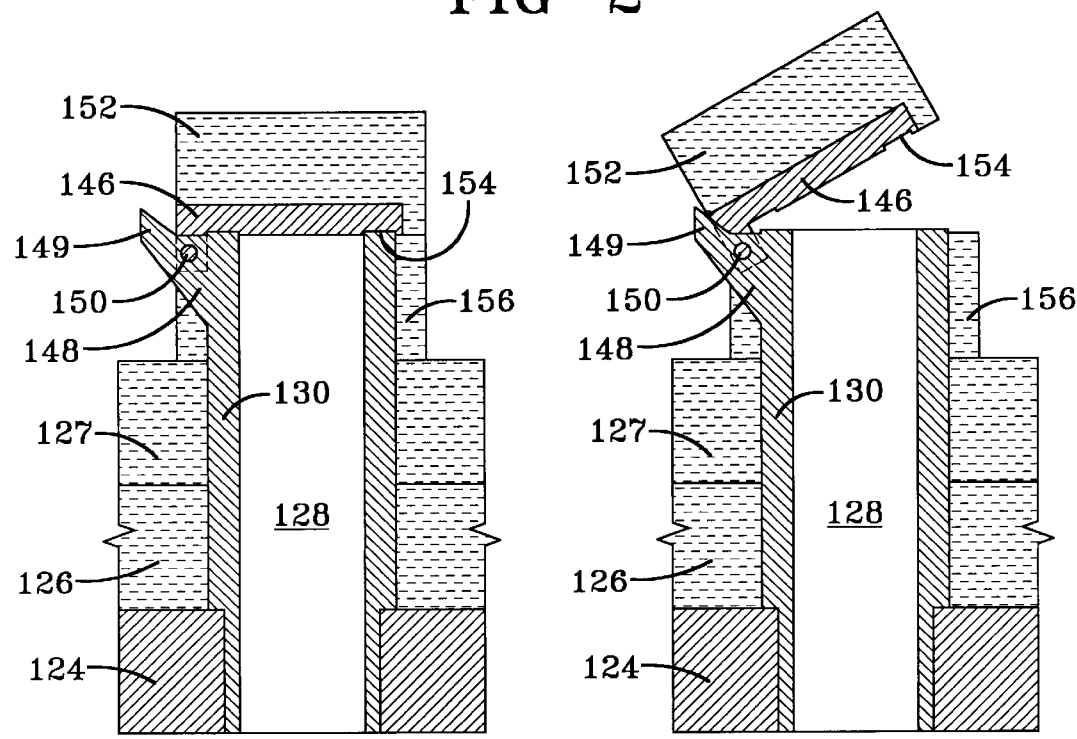
FIG. 9 presents an enlarged side cross-sectional view of an exhaust stack according to an aspect of the invention.
FIG. 10 presents the FIG. 9 exhaust stack with the exhaust lid opened.

Referring now to FIGS. 9 and 10, enlarged cross-sectional views of a preferred embodiment of the gas exhaust tube 130 are presented. FIG. 9 presents a view of the portion of the susceptor lid 120 along line 9—9 of FIG. 8 with the exhaust lid 136 in a first position wherein the gas exhaust hole 128 is covered. FIG. 10 presents a view of the same portion of the susceptor lid body 120 as FIG. 9, except the exhaust lid 136 is in a second position wherein the exhaust lid 136 partially uncovers the gas exhaust hole 128. In this example of an aspect of the invention, the exhaust lid 136 comprises a flapper 146 hinged to the susceptor lid body 120 overlying the exhaust hole 128. The exhaust lid 136 is configured to reversibly move from the first position (FIG. 9) wherein the exhaust lid 136 covers the gas exhaust hole 128 to the second position (FIG. 10) wherein the gas exhaust lid 136 at least partially uncovers the gas exhaust hole 128. The gas exhaust tube 130 may be provided with a knuckle 148 that mates with the flapper 146 and is attached thereto by a hinge pin 150. This arrangement permits the flapper 146 to easily rotate around the hinge pin 150. According to this embodiment, the flapper 146 is rotated from the first position to the second position by the presence of gas flow through the gas exhaust hole 128. Terminating the gas flow causes the flapper 146 to return to the first position. The flapper 146 preferably comprises a recess 154 where it mates to the exhaust tube 130, and is preferably provided with a flapper insulation cap 152 that covers the outer exposed portions of the flapper 146. The outside of the gas exhaust tube 130 that extends above the second insulation layer 127 is preferably enveloped by an exhaust tube insulation sleeve 156. A flapper stop 149 may be provided that limits rotation of the flapper 146 and prevents over-rotation of the flapper 146 to a position where it will not close upon termination of gas flow through the gas exhaust hole 128. In the example presented, the flapper stop 149 is integrally formed as a part of the knuckle 148.

Methods according to various aspects of the invention are also provided. Referring again to FIGS. 1, 3 and 4, a method is provided for exhausting a gas through the susceptor lid 30, comprising the steps of covering the gas exhaust hole 102 in the susceptor lid 30 disposed within the CVI/CVD furnace 10; and, uncovering the gas exhaust hole 102 within the CVI/CVD furnace, at least partially, to permit gas to pass through the gas exhaust hole 102. According to a further aspect of the invention, a method is provided for exhausting a gas through the susceptor lid 30, comprising the steps of covering the gas exhaust hole 102 in the susceptor lid 30 disposed within a CVI/CVD furnace 10 while heat treating a substrate 62 disposed within the CVI/CVD furnace 10; and, uncovering the gas exhaust hole 102, at least partially, to permit gas to pass through the gas exhaust hole 102 while CVI/CVD depositing a binding matrix within the substrate 62. A multitude of substrates 62 may be disposed within the CVI/CVD furnace, wherein both the steps are performed upon the multitude of substrates 62. According to a further aspect of the invention, a CVI/CVD method is provided, comprising the steps of heating the substrate 62 disposed within the susceptor 36 within the CVI/CVD furnace 10 to an elevated temperature, the susceptor 26 having a susceptor lid 30; passing a flow of reactant gas into the CVI/CVD furnace 10; exposing the substrate 62 to the reactant gas wherein the reactant gas decomposes and deposits a binding matrix within the substrate 62; exhausting the flow of reactant gas through a gas exhaust hole 102 in the susceptor lid 30; heat treating the substrate 62 within the CVI/CVD furnace 10 at a heat treat temperature greater than the elevated temperature while ceasing to pass the reactant gas around the substrate 62 and covering the gas exhaust 102.

Figure 11:
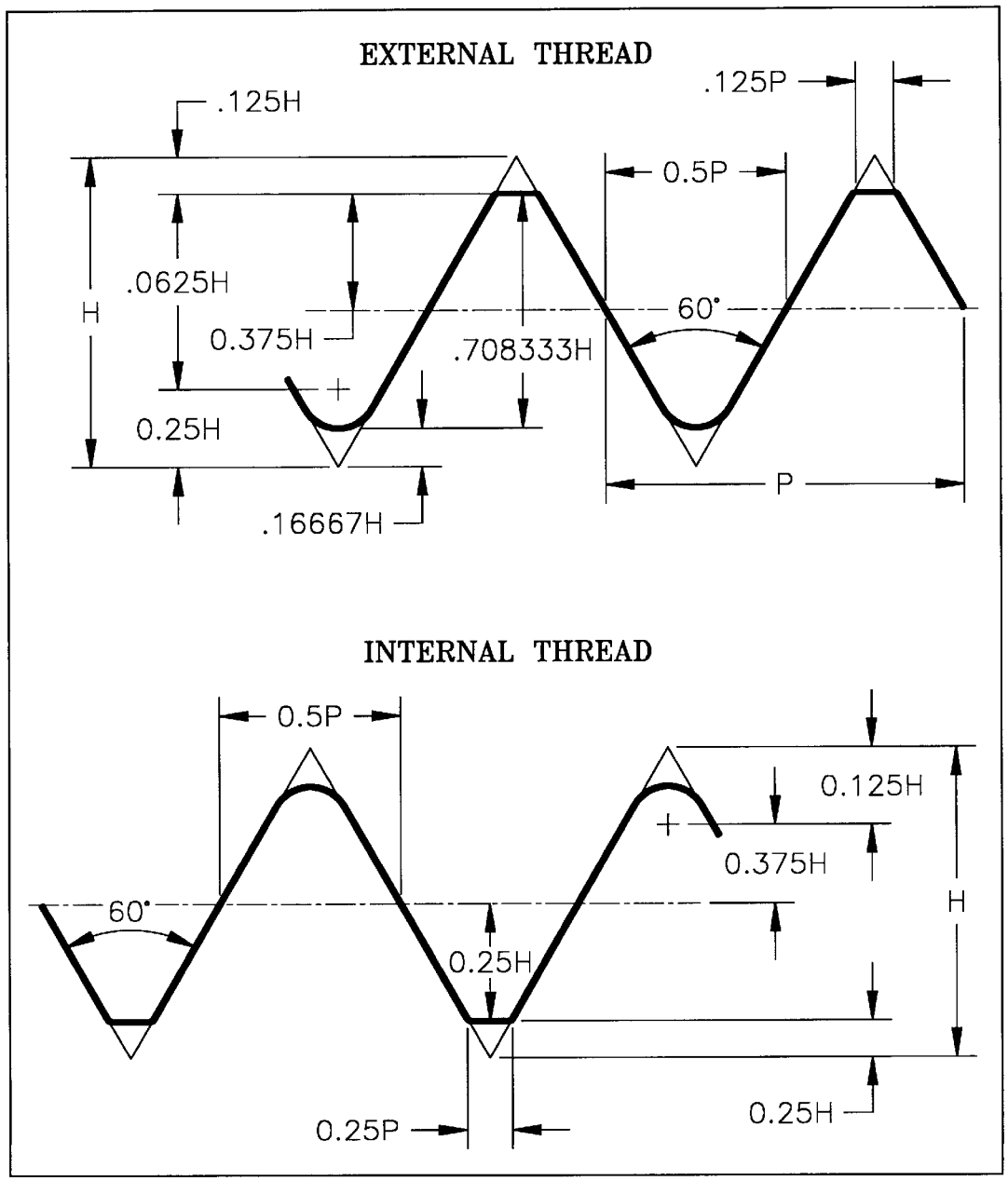
FIG. 11 presents a detailed dimensional view of a thread design according to an aspect of the invention.

Referring now to FIG. 11, a thread design is presented that is suitable for use in lifting the lid, and particularly for use at the lift points 144. The thread design presented in FIG. 11 is designed for maximum thread shear strength for brittle, low fracture toughness and low shear strength materials such as monolithic ceramics and graphite. These materials are also notch sensitive and defect sensitive. Since these threads are designed for lifting an object, i.e. the lid, a high safety factor is desirable to avoid catastrophic failure. The thread design is different from a standard metal thread design in the following ways: larger thread height (or depth), larger pitch, (or less threads per inch), rounded (or non-sharp) crests and troughs, and additional clearance between the internal and external threads. These features allow for a larger quantity of material that makes up the thread and for better load distribution across the thread. Also, the detrimental effects of notch sensitivity and material flaws (voids) are minimized. Moreover, a "V"-type thread (which is used for metallic threads) helps to distribute shear loads more uniformly than other types of threads. All of these features result in a thread that withstands higher ultimate mechanical loads, closer to the theoretical shear/tensile strength of the bulk material.

Mechanical testing of this threadform utilizing different grades of graphite was performed. The ATJ (UCAR) grade demonstrated an average failure load of 2900 lbs, and the CGW (UCAR) grade—a higher strength grade—demonstrated an average failure load of 3425 lbs. Fracture occurred at the base of the first thread (in the graphite lifting post) in the majority of the tests. Using the pitch diameter of 0.7307-inches, a total thread surface area of 2.296 sq. inches can be calculated for the entire 1.0-inch thread length (6 threads) utilized in these tests. This equates to a 1263 psi thread shear strength for the ATJ grade and 1492 psi thread shear strength for the CGW grade. Assuming that the first three threads handles the majority of the load (typical practice), these thread shear strengths can be calculated as 2526 psi and 2984 psi, respectively.

According to a certain embodiment for CVI/CVD processing and heat treating carbon/carbon aircraft brake disks, the susceptor lid 120 of FIG. 8 is employed with the exhaust lid of FIGS. 9 and 10. The susceptor plate 124 is manufactured from monolithic graphic having suitable suscepting properties, such as CS grade graphite, available from UCAR Carbon Company Inc., United States of America, or HLM grade graphite, available from SGL Carbon Corporation, United States of America. The gas exhaust tubes 130 flapper 146 are manufactured from monolithic graphite, such as the CS grade graphite or HLM grade graphite materials just described. The hinge pins 150 may be manufactured from monolithic graphite or carbon/carbon composite. The tie rods 140 and nuts 142 are manufactured from monolithic graphite, such as ATJ grade, available from UCAR Carbon Company Inc. The outer tie rods 140 having threaded holes 144 are manufactured from a monolithic graphite having a greater strength, such as grade ATJ or CGW, available from UCAR Carbon Company Inc., since these are the lift points for moving the entire lid. The flapper insulation cap 152 is manufactured from a graphite foam, such as Cal-Foam® material, available from SIGRI Polyarbon, Inc. The first insulation layer 126 is manufactured from a rigid carbon felt, such as Calcarb CBCF material, available from Calcarb, Ltd., Scotland, or Fibergraph® material, available from SIGRI Polycarbon, Inc., United States of America. All exterior surfaces of the rigid carbon felt components are painted with a graphite paint, such as TC-2 graphite paint, available from EGC Enterprises Inc, United States of America, and then further sealed with an additional coat of phenolic based paint, such as Rigidseal® paint, available from SIGRI Polycarbon, Inc. The second insulation layer 127 is manufactured from a graphite foam, as previously described. All exterior surfaces of the graphite foam layer forming the second insulation layer 127 and flapper insulation cap 152 are coated with a layer of graphite paint, as previously described. The outside curcumferential surface of the first and second insulation layers 126 and 127, the inside surface of the gas exhaust tube 130, and the underside of the flapper 146 that rests on the gas exhaust tube 130 are coated with a graphite foil sheet, such as Grafoil® material available from UCAR Carbon Company Inc., or Calgraph® material, available from SIGRI Polycarbon, Inc., bonded in place using a graphite adhesive, such as Graphi-Bond 669 adhesive, available from Aremco Products Inc., United States of America. A sheet of graphite foil may optionally be bonded to the top surface of the second insulation layer, but is not necessary since the graphite foam coated as described herein is sufficiently abrasion resistant to permit furnace service personnel to walk on its surface.

It is evident that many variations are possible without departing from the true scope and spirit of the invention as defined by the claims that follow.

What is claimed is:

1. A combined heat treat and CVI/CVD susceptor lid for a furnace susceptor, comprising:

a susceptor lid body having a gas exhaust hole; and, an exhaust lid disposed over said gas exhaust hole, said exhaust lid being configured to move within the CVI/CVD furnace from a first position wherein said exhaust lid covers said gas exhaust hole to a second position wherein said gas exhaust lid at least partially uncovers said gas exhaust hole.

2. The apparatus of claim 1, wherein said exhaust lid is configured to reversibly move within the CVI/CVD furnace from a first position wherein said exhaust lid covers said gas exhaust hole to a second position wherein said gas exhaust lid at least partially uncovers said gas exhaust hole.

3. The apparatus of claim 1, wherein said susceptor lid body comprises a plurality of gas exhaust holes and a plurality of exhaust lids disposed over said gas exhaust holes, each gas exhaust hole having a corresponding exhaust lid configured to move from a first position wherein that exhaust lid covers that gas exhaust hole to a second position wherein that exhaust lid at least partially uncovers that gas exhaust hole.

4. The apparatus of claim 1, wherein said susceptor lid body comprises a susceptor plate and a gas exhaust tube attached to said susceptor plate with one end encircling said gas exhaust hole, said exhaust lid being seated upon an opposing end of said gas exhaust tube.

5. The apparatus of claim 1, wherein said susceptor lid body comprises a susceptor plate and an insulation layer overlying said susceptor plate.

6. A combined heat treat and CVI/CVD susceptor lid for a furnace susceptor, comprising:

a susceptor lid body having a gas exhaust hole; and, an exhaust lid seated upon said susceptor lid body disposed over said gas exhaust hole, said exhaust lid being configured to remain in a first position wherein said exhaust lid covers said gas exhaust hole in the absence of gas flow through said gas exhaust hole and to be movable solely by flow of gas through said gas exhaust hole to a second position wherein said gas exhaust lid at least partially uncovers said gas exhaust hole.

7. A combined heat treat and CVI/CVD susceptor lid for a furnace susceptor, comprising:

a susceptor lid body having a gas exhaust hole;

an exhaust lid seated upon said susceptor lid body disposed over said gas exhaust hole, said exhaust lid comprising a flapper hinged to said susceptor lid body overlying said exhaust hole.

8. A combined heat treat and CVI/CVD susceptor lid for a furnace, comprising:

a susceptor plate;

an insulation layer superposing said susceptor plate and attached thereto, said insulation layer defining an exposed upper surface and having sufficient rigidity to permit furnace service personnel to walk on said exposed surface without damaging said insulation layer.

9. The apparatus of claim 8, wherein said susceptor plate and said insulation layer have a gas exhaust hole therethrough, and further comprising an exhaust lid disposed over said gas exhaust hole, said exhaust lid being configured to reversibly move from a first position wherein said exhaust lid covers said gas exhaust hole to a second position wherein said gas exhaust lid at least partially uncovers said gas exhaust hole.

10. In combination, a CVI/CVD and heat treat furnace comprising a susceptor and a susceptor lid, said susceptor lid comprising a susceptor plate having a gas exhaust hole, and an exhaust lid disposed over said gas exhaust hole, said exhaust lid being configured to move from a first position wherein said exhaust lid covers said gas exhaust hole to a second position wherein said gas exhaust lid at least partially uncovers said gas exhaust hole.

11. The apparatus of claim 10, wherein said exhaust lid is configured to reversibly move within said furnace from a first position wherein said exhaust lid covers said gas exhaust hole to a second position wherein said gas exhaust lid at least partially uncovers said gas exhaust hole.

12. The apparatus of claim 10, wherein said exhaust lid is movable from said first position to said second position solely by flow of gas through said gas exhaust hole.

13. A method of exhausting a gas through a susceptor lid, comprising the steps of:

covering a gas exhaust hole in said susceptor lid disposed within a CVI/CVD furnace; and, uncovering said gas exhaust hole within said CVI/CVD furnace, at least partially, to permit gas to pass through said gas exhaust hole.

14. A method of exhausting a gas through a susceptor lid, comprising the steps of:

covering a gas exhaust hole in said susceptor lid disposed within a CVI/CVD furnace while heat treating a substrate disposed within said CVI/CVD furnace; and, uncovering said gas exhaust hole, at least partially, to permit gas to pass through said gas exhaust hole while CVI/CVD depositing a binding matrix within said substrate.

15. The method of claim 14, wherein a multitude of substrates are disposed within said CVI/CVD furnace, and wherein both said steps are performed upon said multitude of substrates.

16. A CVI/CVD method, comprising the steps of:

heating a substrate disposed within a susceptor within said CVI/CVD furnace to an elevated temperature, said susceptor having a susceptor lid;

passing a flow of reactant gas into said CVI/CVD furnace;

exposing said substrate to said reactant gas wherein said reactant gas decomposes and deposits a binding matrix within said substrate;

exhausting said flow of reactant gas through a gas exhaust hole in said susceptor lid;

heat treating said substrate within said CVI/CVD furnace at a heat treat temperature greater than said elevated temperature while ceasing to pass said reactant gas around said substrate and covering said gas exhaust hole.

17. The method of claim 16, wherein a multitude of substrates are disposed within said CVI/CVD furnace that are subjected to said steps.

18. A CVI/CVD method, comprising the steps of:

heat treating a substrate disposed within a susceptor within said CVI/CVD furnace to an elevated temperature, said susceptor having a susceptor lid with at least one gas exhaust hole that is covered;

subsequently uncovering said gas exhaust hole;

passing a flow of reactant gas into said CVI/CVD furnace;

exposing said substrate to said reactant gas wherein said reactant gas decomposes and deposits a binding matrix within said substrate; and, exhausting said flow of reactant gas through said gas exhaust hole.

19. The method of claim 18, wherein a multitude of substrates are disposed within said CVI/CVD furnace that are subjected to said steps.

* * * * *